United States Patent
Jeon

(10) Patent No.: US 9,064,835 B2
(45) Date of Patent: Jun. 23, 2015

(54) THIN-FILM TRANSISTOR ARRAY SUBSTRATE AND DISPLAY DEVICE INCLUDING THE SAME

(71) Applicant: Samsung Display Co., Ltd., Yongin, Gyeonggi-do (KR)

(72) Inventor: Mu-Kyung Jeon, Yongin (KR)

(73) Assignee: Samsung Display Co., Ltd. (KR)

( * ) Notice: Subject to any disclaimer, the term of this patent is extended or adjusted under 35 U.S.C. 154(b) by 97 days.

(21) Appl. No.: 13/802,224

(22) Filed: Mar. 13, 2013

(65) Prior Publication Data

US 2014/0097439 A1    Apr. 10, 2014

(30) Foreign Application Priority Data

Oct. 8, 2012   (KR) .................. 10-2012-0111384

(51) Int. Cl.
  *H01L 29/12* (2006.01)
  *H01L 29/786* (2006.01)
  *H01L 27/32* (2006.01)
  *H01L 27/12* (2006.01)

(52) U.S. Cl.
  CPC .......... *H01L 27/3279* (2013.01); *H01L 27/124* (2013.01)

(58) Field of Classification Search
  USPC ............... 257/59, 88, 109, 762, 71; 438/149
  See application file for complete search history.

(56) References Cited

U.S. PATENT DOCUMENTS

2007/0013077 A1*  1/2007  Lee et al. ................ 257/762
2012/0299028 A1* 11/2012  Tanabe et al. ............. 257/88

FOREIGN PATENT DOCUMENTS

JP    2011-119437    6/2011
KR   10-2003-0058537  7/2003
KR   10-2007-0069387  7/2007

* cited by examiner

*Primary Examiner* — Errol Fernandes
(74) *Attorney, Agent, or Firm* — Knobbe Martens Olson & Bear LLP

(57) ABSTRACT

A TFT array substrate includes: a first insulation layer over a semiconductor layer; a second insulation layer over a plurality of first gate wires formed on the first insulation layer; a third insulation layer over a plurality of second gate wires formed on the second insulation layer; a cover metal formed over the third insulation layer and contacting the semiconductor layer through a contact hole that passes through the first, second and third insulation layers; a fourth insulation layer over the cover metal; a protection layer formed over the fourth insulation layer; and an anode electrode formed over the protection layer and contacting the cover metal through a via hole that passes through the protection layer, the fourth insulation layer, and the contact hole.

20 Claims, 8 Drawing Sheets

THIN-FILM TRANSISTOR ARRAY SUBSTRATE AND DISPLAY DEVICE INCLUDING THE SAME

CROSS-REFERENCE TO RELATED APPLICATIONS

This application claims the benefit of Korean Patent Application No. 10-2012-0111384, filed on Oct. 8, 2012, in the Korean Intellectual Property Office, the disclosure of which is incorporated herein in its entirety by reference.

BACKGROUND

1. Field

The present invention relates to a thin-film transistor (TFT) array substrate and a display device including the TFT array substrate.

2. Description of the Related Technology

A display device is a device for displaying an image. An organic light emitting display device has been recently spotlighted as a display device.

The organic light emitting display device has a self-emitting characteristic, and does not need a separate light source as a liquid crystal display device does, and thus thickness and weight thereof may be reduced. The organic light emitting display device exhibits high quality characteristics such as low power consumption, high brightness, high response speed, and the like.

In general, the organic light emitting display device includes gate wires disposed on a substrate and extending in one direction, data wires extending in a direction across the gate wires, pixel circuits respectively connected to the gate wires and the data wires, and an organic light emitting diode connected to the pixel circuits. As a high resolution display has been recently pursued, a space for the pixel circuit becomes narrower.

SUMMARY OF CERTAIN INVENTIVE ASPECTS

The present invention provides a display device optimized to high resolution by separating operations of forming low resistance signal wires and cover metal connected to a light emitting element and reducing a size of the cover metal.

According to an aspect of the present invention, there is provided a thin-film transistor (TFT) array substrate including: a first insulation layer over a semiconductor layer; a second insulation layer over a plurality of first gate wires formed on the first insulation layer; a third insulation layer over a plurality of second gate wires formed on the second insulation layer; a cover metal formed over the third insulation layer and contacting the semiconductor layer through a contact hole that passes through the first, second and third insulation layers; a fourth insulation layer over the cover metal; a protection layer formed on the fourth insulation layer; and an anode electrode formed over the protection layer and contacting the cover metal through a via hole that passes through the protection layer, the fourth insulation layer, and the contact hole.

The cover metal may include molybdenum (Mo), and at least one surface of the cover metal may be identical in size to or smaller than a corresponding surface of the via hole.

The TFT array substrate may further include: a capacitor including a first electrode formed of the same material as a material forming the plurality of first gate wires and formed in the same layer as the plurality of first gate wires and a second electrode formed of the same material as a material forming the plurality of second gate wires and formed in the same layer as the plurality of second gate wires; and a plurality of second signal wires disposed over the fourth insulation layer and overlapping with the second electrode of the capacitor, wherein the plurality of second signal wires are spaced apart from the first capacitor by at least the third insulation layer and the fourth insulation layer.

The plurality of second signal wires may include aluminum (Al).

The plurality of second signal wires may include a data line and a driving voltage line, wherein the driving voltage line is connected to the second electrode of the capacitor through a contact hole that passes through the third insulation layer and the fourth insulation layer.

The plurality of first gate wires may include a second scan line and a light emitting control line, and the plurality of second gate wires may include a first scan line and an initialization voltage line.

According to another aspect of the present invention, there is provided a display device including: first, second, third and fourth insulation layers stacked over a semiconductor layer; a plurality of first signal wires including a plurality of first gate wires formed between the first insulation layer and the second insulation layer and a plurality of second gate wires formed between the second insulation layer and the third insulation layer; a plurality of second signal wires formed on the fourth insulation layer; at least one thin film transistors (TFT) and at least one capacitor connected to the plurality of first signal wires and to the plurality of second signal wires; a cover metal formed between the third insulation layer and the fourth insulation layer and contacting the semiconductor layer through a contact hole that passes through the first, second and third insulation layers; and a light emitting element formed over a protection layer disposed on the fourth insulation layer and including an anode electrode contacting the cover metal through a via hole that passes through the protection layer and the fourth insulation layer, a cathode electrode facing the anode electrode, and an emissive layer between the anode electrode and the cathode electrode.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

Figure 1:
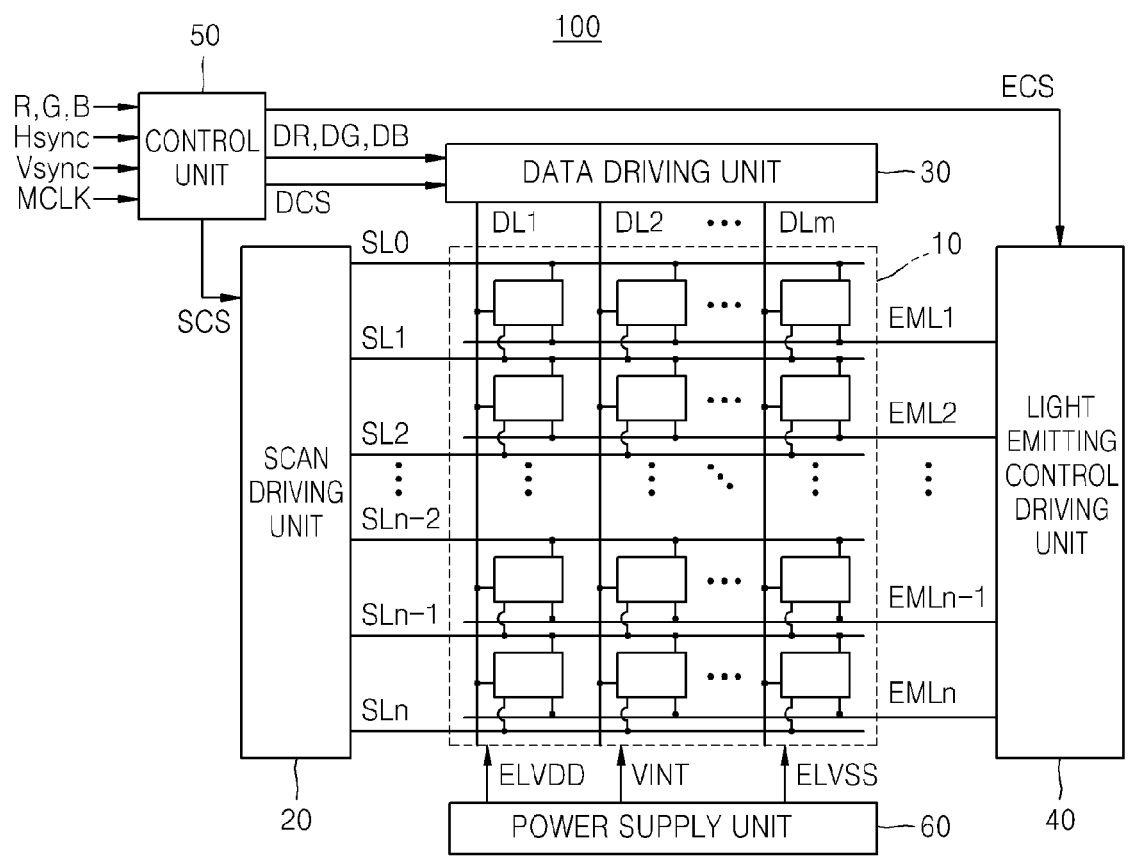
FIG. 1 is a schematic block diagram of a display device according to an embodiment of the present invention.

In the following detailed description, only certain embodiments of the present invention have been shown and described, simply by way of illustration. As those skilled in the art would realize, the described embodiments may be modified in various ways, without departing from the spirit or scope of the present invention.

Accordingly, the drawings and description are to be regarded as illustrative in nature and not restrictive. Like reference numerals generally designate like elements throughout the specification.

Sizes and thicknesses of the elements shown in the drawings are for the purpose of descriptive convenience, and thus the present invention is not necessarily limited thereto.

Thicknesses of layers and regions may be expanded in the drawings for clarity. For descriptive convenience, thicknesses of some layers and regions may be exaggerated in the drawings. When an element such as a layer, a film, a region, and a board is referred to as being "on" another element, the element can be directly on the other element or intervening elements may be present.

Throughout this disclosure, unless explicitly described to the contrary, the word "comprise" and variations such as "comprises" or "comprising", will be understood to imply the inclusion of stated elements but not the exclusion of any other elements. Further, throughout this disclosure, the term "above" encompasses an orientation of both above and below, and does not necessarily encompass the orientation of above with respect to a direction of gravity.

FIG. 1 is a schematic block diagram of a display device 100 according to an embodiment of the present invention.

The display device 100 according to an embodiment of the present invention includes a display unit 10 including a plurality of pixels, a scan driving unit 20, a data driving unit 30, a light emitting control driving unit 40, a control unit 50, and a power supply unit 60 that supplies an external voltage to the display device 100.

The display unit 10 is disposed at a crossing of a plurality of scan lines SL0 through SLn, a plurality of data lines DL1 through DLm, and a plurality of light emitting control lines EML1 through EMLn, and includes a plurality of pixels arranged in an approximately matrix shape. The plurality of pixels receive external voltages such as a first power voltage ELVDD, a second voltage ELVSS, and an initialization voltage VINT from the power supply unit 60. The first power voltage ELVDD may be a predetermined high level voltage. The second power voltage ELVSS may be a voltage lower than the first power voltage ELVDD, or a ground voltage.

Each of the pixels is connected to two of the plurality of scan lines SL0 through SLn transferred to the display unit 10. Although each of the pixels is connected to a scan line corresponding to a pixel line and a scan line of a pixel line previous to the pixel line in FIG. 1, the present invention is not necessarily limited thereto.

Each of the pixels is also connected to one of the plurality of data lines DL1 through DLm transferred to the display unit 10 and one of the plurality of light emitting control lines EML1 through EMLn transferred to the display unit 10.

The scan driving unit 20 generates and transfers two corresponding scan signals to each of the pixels through the plurality of scan lines SL0 through SLn. That is, the scan driving unit 20 transfers a first scan signal through the scan line corresponding to the pixel line which each of the pixels is included, and transfers a second scan signal through the scan line of the pixel line previous to the pixel line. For example, the scan driving unit 20 transfers a first scan signal Sn through the nth scan line SLn and a second scan signal Sn−1 through an n−1th scan line SLn−1 to a pixel disposed at an mth row of an nth pixel line.

The data driving unit 30 transfers data signals D1 through Dm to each of the pixels through the plurality of data lines DL1 through DLm.

The light emitting control driving unit 40 generates and transfers light emitting control signals EM1 through EMn to each of the pixels through the plurality of light emitting control lines EML1 through EMLn.

The control unit 50 changes a plurality of image signals R, G, B transferred from the outside to a plurality of image data signals DR, DG, and DB, and transfers the changed image data signals DR, DG, and DB to the data driving unit 30. The control unit 50 also receives a vertical sync signal Vsync, a horizontal sync signal Hsync, and a clock signal MCLK and generates and transfers control signals for controlling driving of the scan driving unit 20, the data driving unit 30, and the light emitting control driving unit 40. The control unit 50 generates and transfers a scan driving control signal, SCS, for controlling the scan driving unit 20, a data driving control signal, DCS, for controlling the data driving unit 30, and a light emitting driving control signal, ECS, for controlling the light emitting control driving unit 40.

Figure 2:
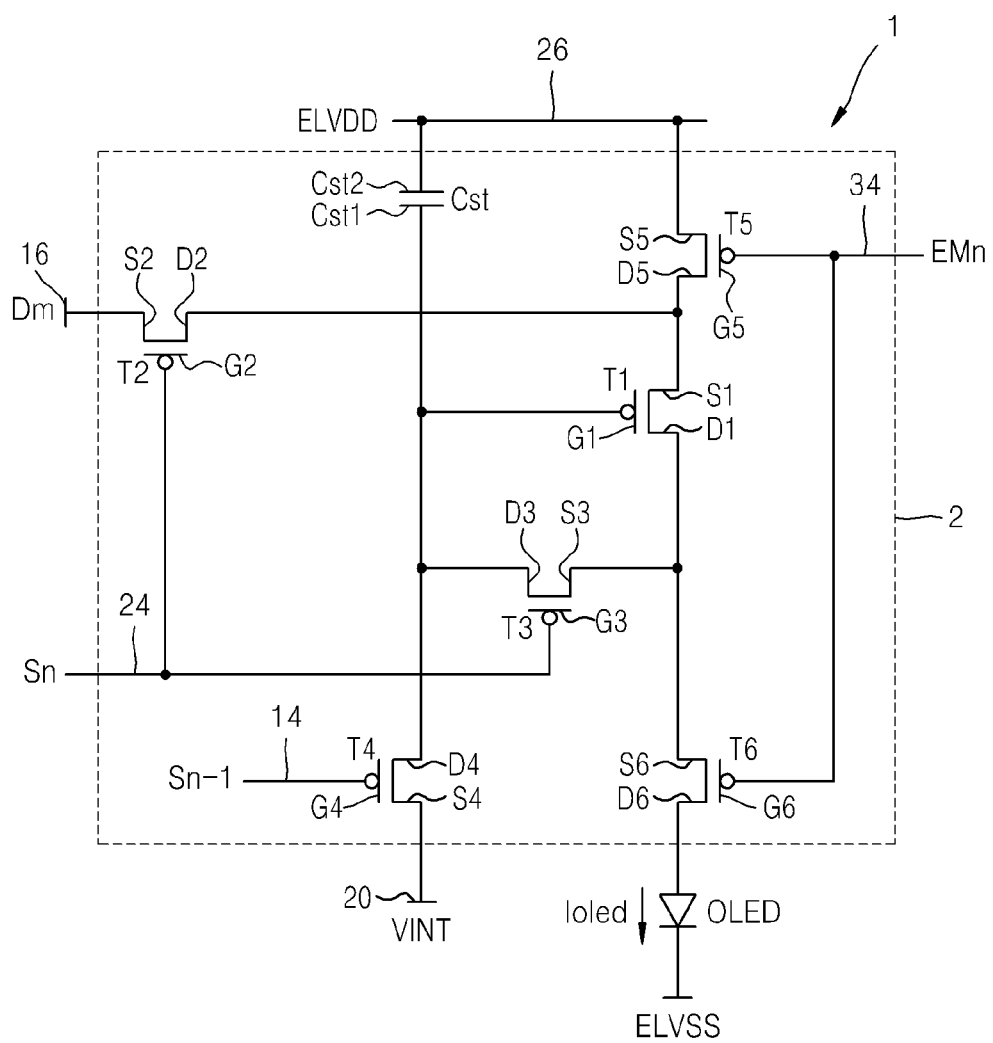
FIG. 2 is an equivalent circuit diagram of one pixel of a display device according to an embodiment of the present invention.

As seen in FIG. 2, each of the plurality of pixels emits light of a predetermined brightness by a driving current Ioled supplied to an organic light emitting diode (OLED) according to the data signals D0 through Dm transferred through the plurality of data lines DL1 through DLm.

FIG. 2 is an equivalent circuit diagram of one pixel 1 of a display device according to an embodiment of the present invention. The pixel 1 of FIG. 2 is one of a plurality of pixels included in an nth pixel line and connected to the first scan line SLn corresponding to the nth pixel line and the second scan line SLn−1 corresponding to an n−1th pixel line previous to the nth pixel line.

The pixel 1 of the organic light emitting display device according to an embodiment of the present invention includes a pixel circuit 2 including a plurality of thin film transistors (TFTs) T1 through T6 and a storage capacitor Cst. The pixel 1 includes an OLED that receives a driving current from the pixel circuit 2 and emits light.

The TFTs T1 through T6 includes a driving TFT T1, a switching TFT T2, a compensation TFT T3, an initialization TFT T4, a first light emitting control TFT T5, and a second light emitting control TFT T6.

The pixel 1 includes a first scan line 24 that transfers the first scan signal Sn to the switching TFT T2 and the compensation TFT T3, and a second scan line 14 that transfers the second scan signal Sn−1, that is a previous scan signal, to the initialization TFT T4. The pixel 1 also includes a light emitting control line 34 that transfers the light emitting control signal EMn to the first light emitting control TFT T5 and the second light emitting control TFT T6, and a data line 16 that crosses the first scan line 24 and transfers the data signal Dm. The pixel 1 also includes a driving voltage line 26 that transfers the first power voltage ELVDD and is formed substantially in parallel to the data line 16. The pixel 1 also includes an initialization voltage line 20 that transfers the initialization voltage VINT for initializing the driving TFT T1.

A gate electrode G1 of the driving TFT T1 is connected to a first electrode Cst1 of the storage capacitor Cst. A source electrode S1 of the driving TFT T1 is connected to the driving voltage line 26 via the first light emitting control TFT T5. A drain electrode D1 of the driving TFT T1 is electrically connected to an anode electrode of the OLED via the second light emitting control TFT T6. The driving TFT T1 receives the data signal Dm according to a switching operation of the switching TFT T2 and supplies the driving current Ioled to the OLED.

A gate electrode G2 of the switching TFT T2 is connected to the first scan line 24. A source electrode S2 of the switching TFT T2 is connected to the data line 16. A drain electrode D2 of the switching TFT T2 is connected to the source electrode S1 of the driving TFT T1 and the driving voltage 26 via the first light emitting control TFT T5. The switching TFT T2 is turned on according to the scan signal Sn received through the first scan line 24 and performs a switching operation of transferring the data signal Dm received through the data line 16 to the source electrode S1 of the driving TFT T1.

A gate electrode G3 of the compensation TFT T3 is connected to the first scan line 24. A source electrode S3 of the compensation TFT T3 is connected to the drain electrode D1 of the driving TFT T1 and the anode electrode of the OLED via the second light emitting control TFT T6. A drain electrode D3 of the compensation TFT T3 is connected to the first electrode Cst1 of the storage capacitor Cst, a drain electrode D4 of the initialization TFT T4, and the gate electrode G1 of the driving TFT T1. The compensation TFT T3 is turned on according to the first scan signal Sn received through the first scan line 24, connects the gate electrode G1 and the drain electrode D1 of the driving TFT T1, and diode-connects the driving TFT T1.

A gate electrode G4 of the initialization TFT T4 is connected to the second scan line 14. A source electrode S4 of the initialization TFT T4 is connected to the initialization voltage line 20. The drain electrode D4 of the initialization TFT T4 is connected to the first electrode Cst1 of the storage capacitor Cst, the drain electrode D3 of the compensation TFT T3, and the gate electrode G1 of the driving TFT T1. The initialization TFT T4 is turned on according to the second scan signal Sn−1 received through the second scan line 14, transfers the initialization voltage VINT to the gate electrode G1 of the driving TFT T1, and performs an initialization operation of initializing a voltage of the gate electrode G1 of the driving TFT T1.

A gate electrode G5 of the first light emitting control TFT T5 is connected to the light emitting control line 34. A source electrode S5 of the first light emitting control TFT T5 is connected to the driving voltage line 26. A drain electrode D5 of the first light emitting control TFT T5 is connected to the source electrode S1 of the driving TFT T1 and the drain electrode D2 of the switching TFT T2.

A gate electrode G6 of the second light emitting control TFT T6 is connected to the light emitting control line 34. A source electrode S6 of the second light emitting control TFT T6 is connected to the drain electrode D1 of the driving TFT T1 and the source electrode S3 of the compensation TFT T3. A drain electrode D6 of the second light emitting control TFT T6 is electrically connected to the anode electrode of the OLED. The first light emitting control TFT T5 and the second light emitting control TFT T6 are concurrently turned on according to the light emitting control signal EMn received through the light emitting control line 34 so that the first power voltage ELVDD is transferred to the OLED, and the driving current Ioled flows through the OLED.

A second electrode Cst2 of the storage capacitor Cst is connected to the driving voltage line 26. The first electrode Cst1 of the storage capacitor Cst is connected to the gate electrode G1 of the driving TFT T1, the drain electrode D3 of the compensation TFT T3, and the drain electrode D4 of the initialization TFT T4.

A cathode electrode of the OLED is connected to the second power voltage EVLSS. The OLED receives the driving current Ioled from the driving TFT T1, emits light, and displays an image.

Figure 3:
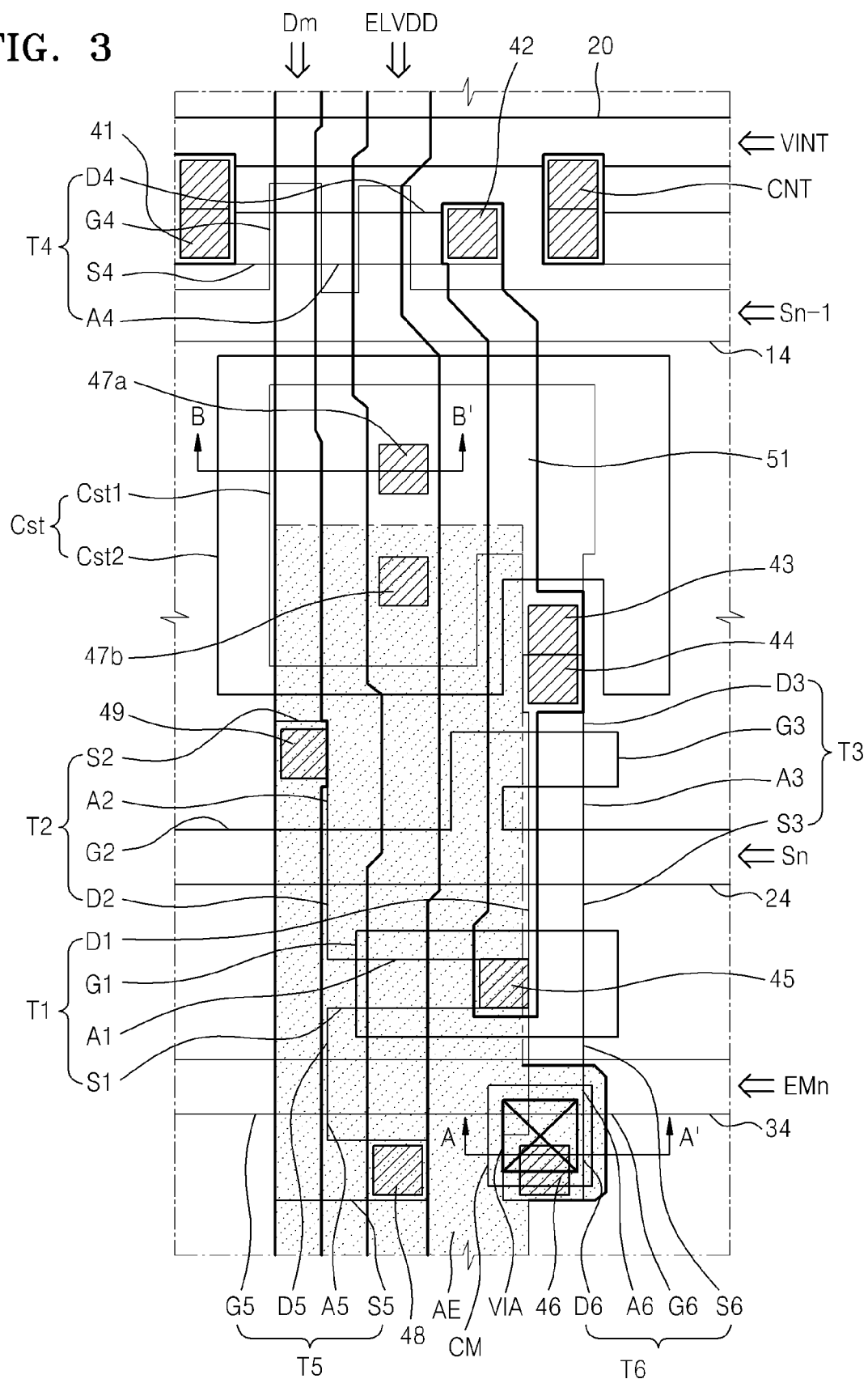
FIG. 3 is a schematic plan view of the pixel of FIG. 2 according to an embodiment of the present invention.
Figure 4:
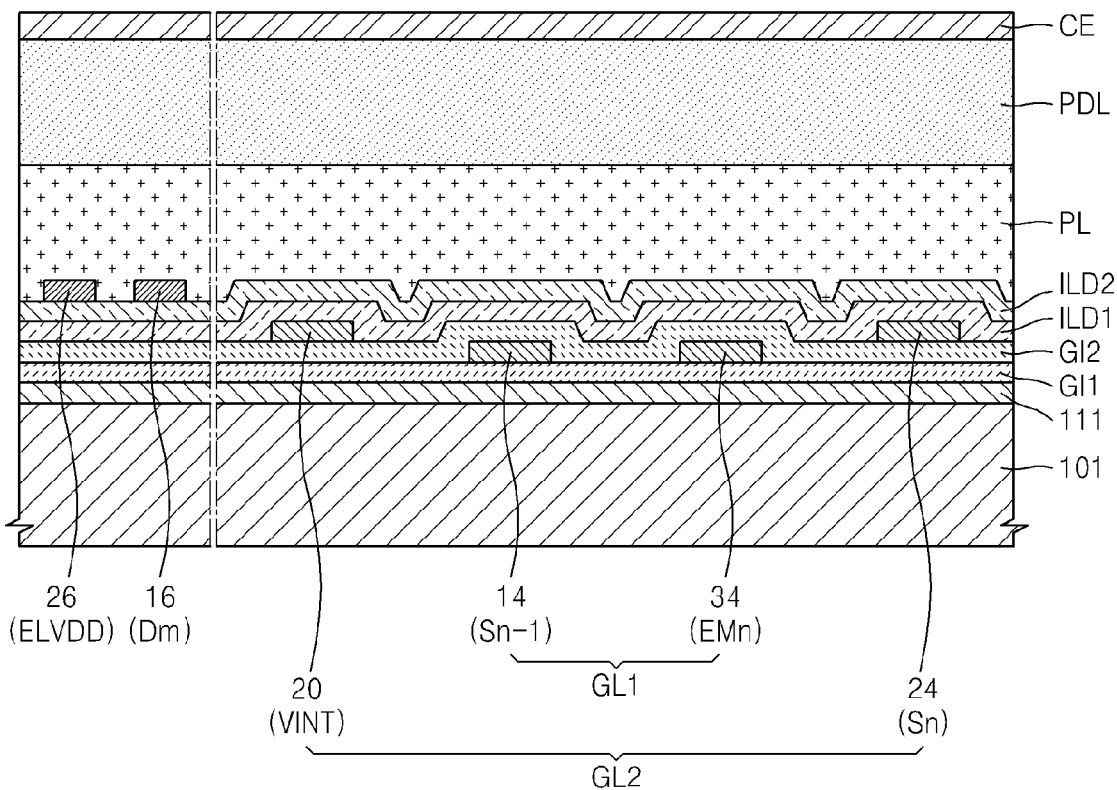
FIG. 4 is a cross-sectional view of each signal line of FIG. 3.

FIG. 3 is a schematic plane view of the pixel 1 of FIG. 2 according to an embodiment of the present invention. FIG. 4 is a cross-sectional view of each signal line of FIG. 3.

Referring to FIGS. 3 and 4, the pixel 1 according to an embodiment of the present invention includes the first scan line 24, the second scan line 14, the light emitting control line 34, and the initialization voltage line 20 that respectively apply the first scan signal Sn, the second scan signal Sn−1, the light emitting control signal EMn, and the initialization voltage VINT and are formed in a row direction. The pixel 1 also includes the data line 16 and the driving voltage line 26 that cross the first scan line 24, the second scan line 14, the light emitting control line 34, and the initialization voltage line 20, and respectively apply the data signal Dm and the first power voltage ELVDD to the pixel 1.

The second scan line 14 and the light emitting control line 34 are included in a first gate wire GL1. The initialization voltage line 20 and the first scan line 24 are included in a second gate wire GL2. The first gate wire GL1 and the second gate wire GL2 are disposed at different layers with a second insulation layer GL2 therebetween so that a distance between neighboring gate wires disposed at different layers may be narrow, thereby forming more pixels in the same area. That is, a high resolution display device may be implemented.

The data line 16 and the driving voltage line 26 are second signal wires disposed on the second gate wire GL2 with a third insulation layer ILD1 and a fourth insulation layer ILD2 therebetween. The second signal wires cross first signal wires including the first gate wire GL1 and the second gate wire GL2. The second signal wires are formed as low resistance wires.

As shown in FIG. 3, the driving TFT T1, the switching TFT T2, the compensation TFT T3, the initialization TFT T4, the first light emitting control TFT T5, and the second light emitting control TFT T6, the storage capacitor Cst, and the OLED are also formed in the pixel 1 according to an embodiment of the present invention.

The driving TFT T1 includes a driving semiconductor layer A1, a driving gate electrode G1, a driving source electrode S1, and a driving drain electrode D1. The driving source electrode S1 corresponds to a driving source area doped with impurities in the driving semiconductor layer A1. The driving drain electrode D1 corresponds to a driving drain area doped with impurities in the driving semiconductor layer A1. The driving gate electrode G1 is connected to the first electrode Cst1 of the storage capacitor Cst, the drain electrode D3 of the compensation TFT T3, and the drain electrode D4 of the initialization TFT T4 by a connection member 51 through contact holes 42 through 45.

The switching TFT T2 includes a switching semiconductor layer A2, a switching gate electrode G2, a switching source electrode S2, and a switching drain electrode D2. The switching source electrode S2 corresponds to a switching source area doped with impurities in the switching semiconductor layer A2. The switching drain electrode D2 corresponds to a switching drain area doped with impurities in the switching semiconductor layer A2. The switching source electrode S2 is connected to the data line 16 through the contact hole 49. The switching drain electrode D2 is connected to the driving TFT T1 and the first light emitting control TFT T5. The switching gate electrode G2 is connected to the first scan line 24.

The compensation TFT T3 includes a compensation semiconductor layer A3, a compensation gate electrode G3, a compensation source electrode S3, and a compensation drain electrode D3. The compensation source electrode S3 corresponds to a compensation source area doped with impurities in the compensation semiconductor layer A3. The compensation drain electrode D3 corresponds to a compensation drain area doped with impurities in the compensation semiconductor layer A3. The compensation gate electrode G3 forms a dual gate electrode and prevents a leakage current.

The initialization TFT T4 includes an initialization semiconductor layer A4, an initialization gate electrode G4, an initialization source electrode S4, and an initialization drain electrode D4. The initialization source electrode S4 corresponds to an initialization source area doped with impurities in the initialization semiconductor layer A4. The initialization drain electrode D4 corresponds to an initialization drain area doped with impurities in the initialization semiconductor layer A4. The initialization source electrode S4 may be connected to the initialization voltage line 20 through a contact hole 41.

The first light emitting control TFT T5 includes a first light emitting control semiconductor layer A5, a first light emitting control gate electrode G5, a first light emitting control source electrode S5, and a first light emitting control drain electrode D5. The first light emitting control source electrode S5 corresponds to a first light emitting control source area doped with impurities in the first light emitting control semiconductor layer A5. The first light emitting control drain electrode D5 corresponds to a first light emitting control drain area doped with impurities in the first light emitting control semiconductor layer A5. The first light emitting control source electrode S5 may be connected to the initialization voltage line 20 through a contact hole 48.

The second light emitting control TFT T6 includes a second light emitting control semiconductor layer A6, a second light emitting control gate electrode G6, a second light emitting control source electrode S6, and a second light emitting control drain electrode D6. The second light emitting control source electrode S6 corresponds to a light emitting control source area doped with impurities in the second light emitting control semiconductor layer A6. The first light emitting control drain electrode D5 corresponds to a light emitting control drain area doped with impurities in the second light emitting control semiconductor layer A6. The second light emitting control drain electrode D6 is connected to a cover metal CM through the contact hole 46 and the anode electrode AE of the OLED through a via hole VIA connected to the cover metal CM.

The first electrode Cst1 of the storage capacitor Cst is connected to the compensation drain electrode D3 of the compensation TFT T3, the initialization drain electrode D4 of the initialization TFT T4, and the driving gate electrode G1 of the driving TFT T1 by the connection member 51. The connection member 51 is formed in the same layer as the data line 16.

The second electrode Cst2 of the storage capacitor Cst is connected to the driving voltage line 26 through contact holes 47a and 47b to receive the driving voltage ELVDD from the driving voltage line 26.

Figure 5:
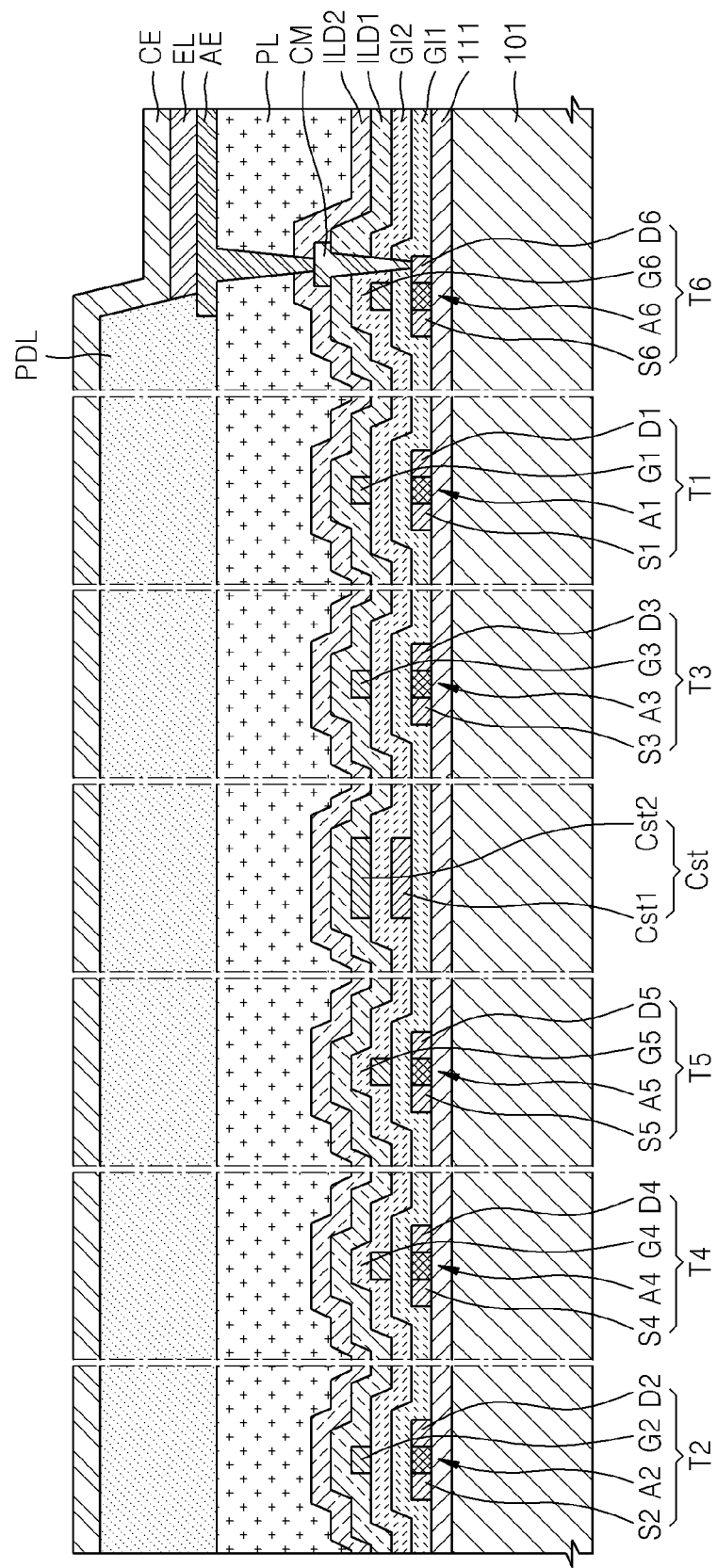
FIG. 5 is a cross-sectional view of a pixel circuit and an organic light emitting diode (OLED) of FIG. 3.
Figure 6:
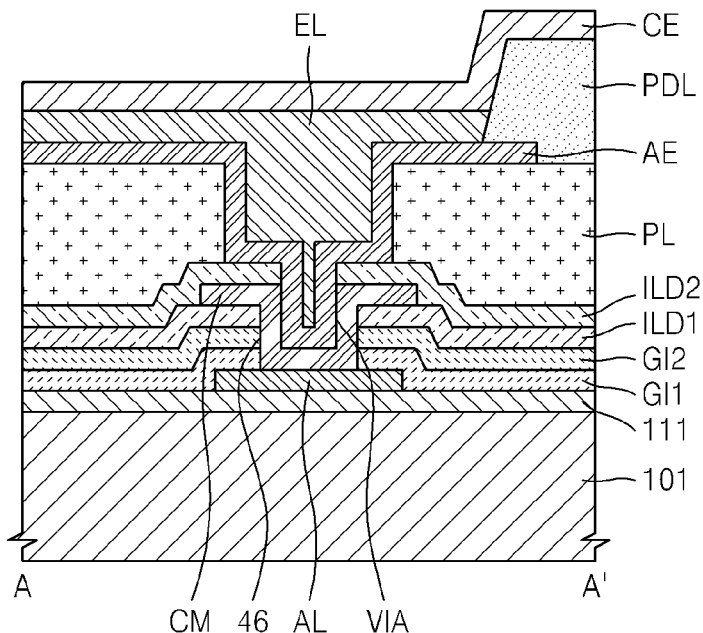
FIG. 6 is a cross-sectional view of a line A-A' of FIG. 3.
Figure 9:
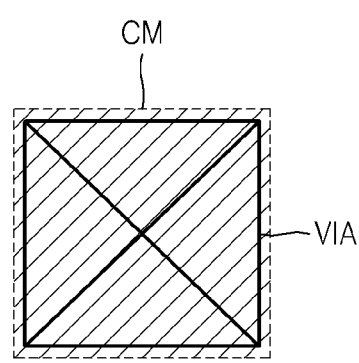
FIG. 9 is a cross-sectional view of a line B-B' of FIG. 3.

FIG. 5 is a cross-sectional view of a pixel circuit and an OLED of FIG. 3. FIG. 6 is a cross-sectional view of a line A-A' of FIG. 3. FIG. 9 is a cross-sectional view of a line B-B' of FIG. 3.

Referring to FIG. 5, a buffer layer 111 is formed on a substrate 101.

The driving semiconductor layer A1 of the driving TFT T1, the switching semiconductor layer A2 of the switching TFT T2, the compensation semiconductor layer A3 of the compensation TFT T3, the initialization semiconductor layer A4 of the initialization TFT T4, the first light emitting control semiconductor layer A5 of the first light emitting control TFT T5, and the second light emitting control semiconductor layer A6 of the second light emitting control TFT T6 are formed on the buffer layer 111 through patterning. The semiconductor layers A1 through A6 are formed of polysilicon, and include a channel area that is doped with impurities and a source area and a drain area that are formed at both sides of the channel area and doped with impurities. In this regard, impurities vary with respect to a type of a TFT and can be N type impurities or P type impurities.

The first insulation layer GI1 is stacked on an entire surface of the substrate 101 on which the semiconductor layers A1 through A6 are formed. The first insulation layer GI1 functions as a gate insulation layer. The first insulation layer GI1 may be formed having a multilayer structure of an organic insulation material or an inorganic insulation material, or the organic insulation material and the inorganic insulation material that alternate with each other.

The initialization gate electrode G4 of the initialization TFT T4, the first light emitting control gate electrode G5 of the first light emitting control TFT T5, and the second light emitting control gate electrode G6 of the second light emitting control TFT T6 are formed on the first insulation layer GI1. Also, the first electrode Cst1 of the storage capacitor Cst is formed on the first insulation layer GI1. The initialization gate electrode G4, the first light emitting control gate electrode G5, the second light emitting control gate electrode G6, and the first electrode Cst1 of the storage capacitor Cst are formed of a material of the first gate wire GL1. The material of the first gate wire GL1 may include a low resistance metal material such as aluminum (Al), copper (Cu), and the like.

The second insulation layer GI2 is stacked on the entire surface of the substrate 101 on which the initialization gate electrode G4, the first light emitting control gate electrode G5, the second light emitting control gate electrode G6, and the first electrode Cst1 of the storage capacitor Cst are formed. The second insulation layer GI2 functions as a gate insulation layer. The second insulation layer GI2 may be formed having a multilayer structure of an organic insulation material or an inorganic insulation material, or the organic insulation material and the inorganic insulation material that alternate with each other.

The driving gate electrode G1 of the driving TFT T1, the switching gate electrode G2 of the switching TFT T2, and the compensation gate electrode G3 of the compensation TFT T3 are formed on the second insulation layer GI2. The second electrode Cst2 of the storage capacitor Cst is also formed on the second insulation layer GI2. The driving gate electrode G1, the switching gate electrode G2, the compensation gate electrode G3, and the second electrode Cst2 of the storage capacitor Cst are formed of a material of the second gate wire GL2. The material of the second gate wire GL2 may include a low resistance metal material such as aluminum (Al), copper (Cu), and the like, similar to the material of the first gate wire GL1.

A third insulation layer IDL1 is stacked on the entire surface of the substrate 101 on which the driving gate electrode G1, the switching gate electrode G2, the compensation gate electrode G3, and the second electrode Cst2 of the storage capacitor Cst are formed. The third insulation layer IDL1 functions as an interlayer insulation layer.

The cover metal CM is connected to the second light emitting control semiconductor layer A6 of the second light emitting control TFT T6 through the contact hole 46 that passes through the first insulation layer GI1, the second insulation layer GI2, and the third insulation layer ILD1 on the third insulation layer ILD1 in the second light emitting control TFT T6.

Referring to FIG. 6, the cover metal CM contacts a drain area of the second light emitting control semiconductor layer A6 of the second light emitting control TFT T6, i.e. a part AL of the second light emitting control drain electrode D6, through the contact hole 46. A fourth insulation layer ILD2 is stacked on the entire surface of the substrate 101 on the cover metal CM. The fourth insulation layer ILD2 functions as an interlayer insulation layer.

Figure 8:
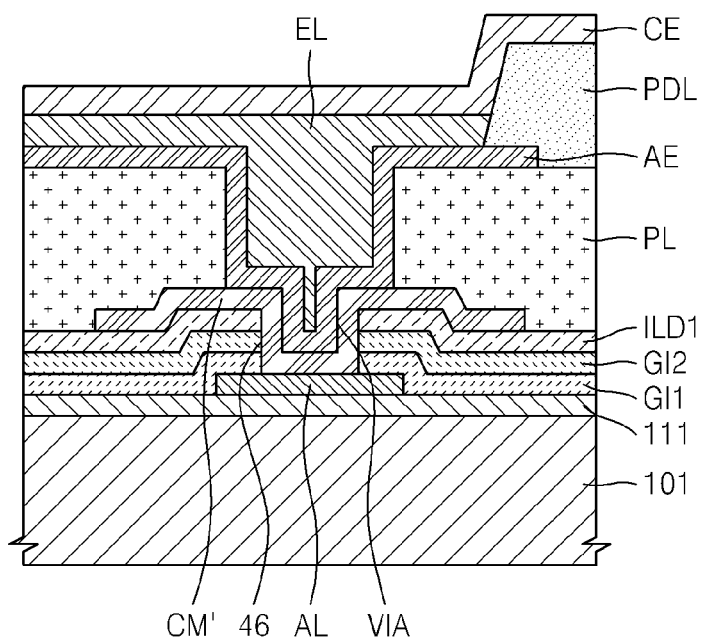
FIG. 8 is a schematic view of a corresponding area of a pixel of a display device according to a comparison example of FIG. 6.

FIG. 8 is a schematic view of a corresponding area of a pixel of a display device according to a comparison example of FIG. 6. In the pixel of FIG. 8, the first insulation layer GI1, the second insulation layer GI2, and the third insulation layer ILD1 are stacked in a lower portion of a cover metal CM'. The cover metal CM' is formed of the same material as those of the driving voltage line 26 and the data line 16 on the third insulation layer ILD1 concurrently with the formation of the driving voltage line 26 and the data line 16. The driving voltage line 26 and the data line 16 are low resistance signal wires, and may be formed as, for example, a three-layer structure of Ti/Al/Ti including aluminum Al. A protection layer PL is formed on the cover metal CM'. The cover metal CM' contacts the anode electrode AE through the via hole VIA that passes through the protection layer PL. The anode electrode AE is formed of a transparent conductive material such as ITO. In this case, the cover metal CM' may be formed of low resistance metal so as to reduce a contact resistance between the cover metal CM' and the anode electrode AE. Accordingly, when the driving voltage line 26 and the data line 16 are formed, the cover metal CM' is formed of the same material as those of the driving voltage line 26 and the data line 16 and the same layer as the driving voltage line 26 and the data line 16. The cover metal CM' is sufficiently wider than the via hole VIA so as to prevent corrosion of aluminum (Al) due to a side exposure of aluminum (Al). However, an increase in the size of the cover metal CM' is a restriction to implementation of high resolution.

As shown in FIG. 6, an operation of forming the cover metal CM is separated from an operation of forming the driving voltage line 26 and the data line 16 in the embodiment of the present invention. Accordingly, a material forming the cover metal CM may be different from those forming the driving voltage line 26 and the data line 16. In the embodiment of the present invention, the cover metal CM is formed of a metal material including at least molybdenum (Mo) on the third insulation layer ILD1, and the driving voltage line 26 and the data line 16 are formed of metal materials including at least aluminum (Al) such as, for example. Ti/Al/Ti on the fourth insulation layer ILD2 disposed on the cover metal CM. Thus, the cover metal CM is not necessarily wider than the via hole VIA.

Figure 7:
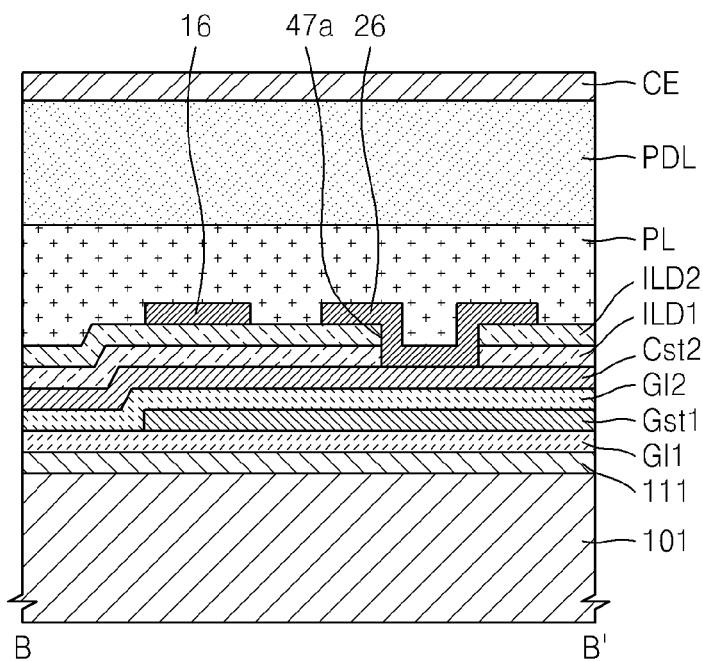
FIG. 7 is a schematic view of an example of sizes of a via hole and a cover metal according to an embodiment of the present invention.

FIG. 7 is a schematic view of an example of sizes of the via hole VIA and the cover metal CM according to an embodiment of the present invention. Referring to FIG. 7, the cover metal CM is formed of a metal material including molybdenum (Mo), a side of the cover metal CM may be exposed to the via hole VIA. Thus, a size of the cover metal CM may be determined in such a manner that at least one surface of the cover metal CM is identical to, or smaller than, the via hole VIA. In the example of FIG. 7, the size of the cover metal CM is almost identical to that of the via hole VIA. The size of the cover metal CM may be configured to be smaller than that of the via hole VIA. That is, compared to the comparison example of FIG. 8, the size of the cover metal CM may be reduced in the embodiment of the present invention. A contact resistance between molybdenum (Mo) and ITO must be smaller than that of Al of Ti/Al/Ti and ITO in order to reduce a contact area. Thus, a pixel optimized to high resolution may be formed in the embodiment of the present invention.

The driving voltage line 26, the connection member 51, and the data line 16 are formed spaced apart from each other on the fourth insulation layer IDL2. The driving voltage line 26 is connected to the second electrode Cst2 of the storage capacitor Cst through the contact holes 47a and 47b that pass through the third insulation layer ILD1 and the fourth insulation layer ILD2, connected to the first light emitting control source electrode S5 of the first light emitting control TFT T5 through the contact hole 48 that passes through the first through fourth insulation layers GI1, GI2, ILD1, and ILD2, and supplies the first power voltage ELVDD thereto. One end of the connection member 51 is connected to the initialization drain electrode D4 of the initialization TFT T4 through the contact hole 42 that passes through the first through fourth insulation layers GI1, GI2, ILD1, and ILD2. Another end of the connection member 51 is connected to the driving gate electrode G1 of the driving TFT T1 through the contact hole 45 that passes through the third and fourth insulation layers ILD1 and ILD2. A center portion of the connection member 51 is connected to the first electrode Cst1 of the storage capacitor Cst through the contact hole 43 that passes through the second through fourth insulation layers GI2, ILD1, and ILD2, and to the compensation drain electrode D3 of the compensation TFT T3 through the contact hole 44 that passes through the first through fourth insulation layers GI1, GI2, ILD1, and ILD2. The data line 16 is connected to the switching source electrode S2 of the switching transistor T2 through the contact hole 49 that passes through the first through fourth insulation layers GI1, GI2, ILD1, and ILD2 and receives the data signal Dm. Materials forming second signal wires including the driving voltage line 26 and the data line 16 may include low resistance metal materials such as aluminum (Al), copper (Cu), and the like. The connection member 51 may be formed of the same material as those of the second signal wires and formed in the same layer as the second signal wires when the second signal wires are formed.

Referring to FIG. 9, the storage capacitor Cst includes the first electrode Cst1 formed of the material forming the first gate wire GL1 and formed on the first insulation layer GI1, and the second electrode Cst2 formed of the material of the second gate wire GL2 and formed on the second insulation layer GI2. The data line 16 and the driving voltage line 26 that are arranged in parallel to each other are disposed on the fourth insulation layer ILD2 to overlap with the storage capacitor Cst. The second electrode Cst2 is connected to the driving voltage line 26 through the contact hole 47a that passes though the third insulation layer ILD1 and the fourth insulation layer ILD2.

Figure 10:
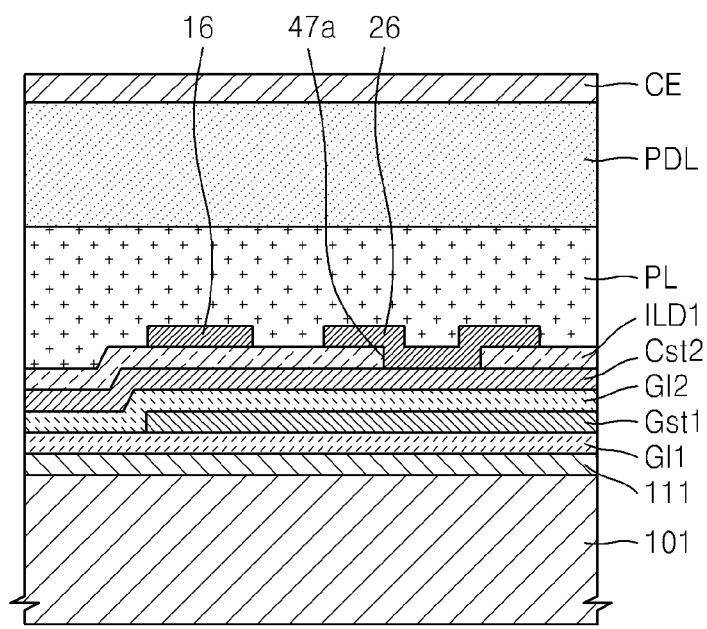
FIG. 10 is a schematic view of a corresponding area of a pixel of a display device according to a comparison example of FIG. 9.

FIG. 10 is a schematic view of a corresponding to an area of a pixel shown in FIG. 9. In the pixel of FIG. 10, the storage capacitor Cst includes the first electrode Cst1 formed of the material forming the first gate wire GL1 and formed on the first insulation layer GI1, and the second electrode Cst2 formed of the material of the second gate wire GL2 and formed on the second insulation layer GI2. The data line 16 and the driving voltage line 26 that are arranged in parallel to each other are overlappingly disposed on the third insulation layer ILD1 disposed on the second electrode Cst, when viewed in a direction perpendicular to a surface of the array substrate. The second electrode Cst2 is connected to the driving voltage line 26 through the contact hole 47a that passes though the third insulation layer ILD1.

In the comparison example of FIG. 10, the third insulation layer ILD1, i.e. one insulation layer, is disposed between the storage capacitor Cst, the data line 16, and the driving voltage line 26, whereas, in the embodiment of the present invention, the third insulation layer ILD1 and the fourth insulation layer IDL2, i.e. two insulation layers, are disposed between the storage capacitor Cst, the data line 16, and the driving voltage line 26. Thus, capacitance between overlapping wires due to an increase in insulation layers may be reduced in the embodiment of the present invention.

The protection layer PL is disposed on the driving voltage line 26, the connection member 51, and the data line 16. The anode electrode AE is connected to the cover metal CM through the via hole VIA that passes through the protection layer PL, the fourth insulation layer IDL2, and the contact hole 46 on the protection layer PL. The anode electrode AE may be formed as a transparent conductive layer including at least one selected from the group consisting of ITO, IZO, ZnO, $In_2O_3$, IGO, and AZO.

A pixel definition layer PDL having an aperture through which a part of the anode electrode AE is exposed may be formed on the anode electrode AE. An emissive layer EL including a plurality of functional layers may be formed in the aperture. A cathode electrode CE may be formed on the entire surface of the substrate 101 on the emissive layer EL. The pixel definition layer PDL may be formed of an organic substance such as polyacrylates resin and polyimdes or a silica based inorganic substance.

Although an active matrix (AM) type organic light emitting display device having a 6Tr-1Cap structure including six TFTs and a capacitor in a pixel is illustrated in the above-described embodiments, the present invention is not limited thereto. Thus, a display device may include a different number of TFTs and capacitors in a pixel, and may be configured to have various structures by further forming a separate wire or omitting an existing wire.

The present invention can provide a display device optimized to high resolution by forming low resistance signal wires and cover metal at different layers using different materials, and reducing a size of the cover metal.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A thin-film transistor (TFT) array substrate comprising:
a first insulation layer over a semiconductor layer;
a second insulation layer over a plurality of first gate wires formed over the first insulation layer;
a third insulation layer over a plurality of second gate wires formed over the second insulation layer;
a cover metal formed over the third insulation layer and contacting the semiconductor layer through a contact hole that passes through the first, second and third insulation layers;
a fourth insulation layer over the cover metal;
a protection layer formed over the fourth insulation layer;
an anode electrode formed over the protection layer and contacting the cover metal through a via hole that passes through the protection layer, the fourth insulation layer, and the contact hole; and
a capacitor comprising:
a first electrode, and
a second electrode; and
a plurality of second signal wires disposed over the fourth insulation layer and overlapping with the second electrode of the capacitor.

2. The TFT array substrate of claim 1, wherein the cover metal comprises molybdenum (Mo).

3. The TFT array substrate of claim 1, wherein at least a size of one surface of the cover metal is the same as or smaller than a size of a corresponding surface of the via hole.

4. A thin-film transistor (TFT) array substrate comprising:
a first insulation layer over a semiconductor layer;
a second insulation layer over a plurality of first gate wires formed over the first insulation layer;
a third insulation layer over a plurality of second gate wires formed over the second insulation layer;
a cover metal formed over the third insulation layer and contacting the semiconductor layer through a contact hole that passes through the first, second and third insulation layers;
a fourth insulation layer over the cover metal;
a protection layer formed over the fourth insulation layer;
an anode electrode formed over the protection layer and contacting the cover metal through a via hole that passes through the protection layer, the fourth insulation layer, and the contact hole; and
a capacitor comprising:
a first electrode formed of the same material as a material forming the plurality of first gate wires and formed in the same layer as the plurality of first gate wires, and
a second electrode formed of the same material as a material forming the plurality of second gate wires and formed in the same layer as the plurality of second gate wires; and
a plurality of second signal wires disposed over the fourth insulation layer and overlapping with the second electrode of the capacitor, wherein the plurality of second signal wires are spaced apart from the capacitor by at least the third insulation layer and the fourth insulation layer.

5. The TFT array substrate of claim 4, wherein the plurality of second signal wires comprises aluminum (Al).

6. The TFT array substrate of claim 4, wherein the plurality of second signal wires comprises a data line and a driving voltage line,
wherein the driving voltage line is connected to the second electrode of the capacitor through a contact hole that passes through the third insulation layer and the fourth insulation layer.

7. The TFT array substrate of claim 6, wherein the plurality of first gate wires comprises a second scan line and a light emitting control line, and
wherein the plurality of second gate wires comprises a first scan line and an initialization voltage line.

8. The TFT array substrate of claim 7, further comprising:
a driving TFT connected to the driving voltage line and a light emitting element; and
a switching TFT connected between the data line and the driving TFT, and
wherein the capacitor is connected to the initialization voltage line and the driving voltage line.

9. The TFT array substrate of claim 8, wherein the capacitor comprises:
a first electrode formed of the same material as a material forming the plurality of first gate wires and formed in the same layer as the plurality of first gate wires, and connected to the initialization voltage line; and
a second electrode formed of the same material as a material forming the plurality of second gate wires and formed in the same layer as the plurality of second gate wires, and connected to the driving voltage line.

10. The TFT array substrate of claim 9, wherein the driving TFT comprises:
a driving semiconductor layer;
a driving gate electrode connected to the first electrode of the capacitor and disposed on the same layer as the plurality of second gate wires;
a driving source electrode connected to the driving voltage line; and
a driving drain electrode connected to a light emitting element.

11. The TFT array substrate of claim 10, wherein the switching TFT comprises:
a switching semiconductor layer;
a switching gate electrode connected to a first scan line and disposed on the same layer as the plurality of second gate wires;
a switching source electrode connected to a data line; and
a switching drain electrode connected to the driving source electrode of the driving TFT.

12. The TFT array substrate of claim 11, further comprising:
a compensation TFT comprising:
a compensation semiconductor layer,
a compensation gate electrode connected to the first scan line and disposed on the same layer as the plurality of second gate wires,
a compensation source electrode connected to the driving drain electrode of the driving TFT, and
a compensation drain electrode connected to a driving gate electrode of the driving TFT.

13. The TFT array substrate of claim 12, further comprising:
an initialization TFT comprising:
an initialization semiconductor layer,
an initialization gate electrode connected to a second scan line and disposed on the same layer as the plurality of first gate wires,
an initialization source electrode connected to an initialization line, and
an initialization drain electrode connected to the driving gate electrode of the driving TFT.

14. The TFT array substrate of claim 13, further comprising:
a first light emitting control TFT comprising:
a first light emitting control semiconductor layer,
a first light emitting control gate electrode connected to a light emitting control line and disposed on the same layer as the plurality of first gate wires,
a first light emitting control source electrode connected to a driving voltage line, and
a first light emitting control drain electrode connected to a driving source electrode of the driving TFT.

15. The TFT array substrate of claim 14, further comprising:
a second light emitting control TFT comprising:
a second light emitting control semiconductor layer,
a second light emitting control gate electrode connected to the light emitting control line and disposed on the same layer as the plurality of first gate wires,
a second light emitting control source electrode connected to the driving drain electrode of the driving TFT, and
a second light emitting control drain electrode connected to a light emitting element.

16. A display device comprising:
first, second, third and fourth insulation layers stacked over a semiconductor layer;
a plurality of first signal wires comprising a plurality of first gate wires formed between the first insulation layer and the second insulation layer, and a plurality of second gate wires formed between the second insulation layer and the third insulation layer;
a plurality of second signal wires formed on the fourth insulation layer;
at least one thin film transistor (TFT) and at least one capacitor connected to the plurality of first signal wires and to the plurality of second signal wires, wherein the at least one capacitor comprises:
a first electrode;
a second electrode,
wherein the plurality of second signal wires overlaps with the second electrode;
a cover metal formed between the third insulation layer and the fourth insulation layer and contacting the semiconductor layer through a contact hole that passes through the first, second and third insulation layers; and
a light emitting element formed over a protection layer disposed on the fourth insulation layer and comprising:
an anode electrode contacting the cover metal through a via hole that passes through the protection layer and the fourth insulation layer,
a cathode electrode facing the anode electrode, and
an emissive layer between the anode electrode and the cathode electrode.

17. The display device of claim 16, wherein the cover metal comprises molybdenum (Mo).

18. The display device of claim 16, wherein a size of at least one surface of the cover metal is identical to or smaller than a size of a corresponding surface of the via hole.

19. The TFT array substrate of claim 16, wherein:
the first electrode is formed of the same material as a material forming the plurality of first gate wires and is formed in the same layer as the plurality of first gate wire, and
the second electrode is formed of the same material as a material forming the plurality of second gate wires and is formed in the same layer as the plurality of second gate wires,
wherein the plurality of second signal wires is disposed on the fourth insulation layer and overlaps with the second electrode of the capacitor when viewed in a direction perpendicular to a surface of the array substrate, and is spaced apart from the capacitor by at least the third insulation layer and the fourth insulation layer.

20. The TFT array substrate of claim 16, wherein the plurality of second signal wires comprises aluminum (Al).

* * * * *